United States Patent [19]

Solomon

[11] 4,300,133
[45] Nov. 10, 1981

[54] SMOKE DETECTOR

[76] Inventor: Elias E. Solomon, 20 Christina Ct., Duxbury, Mass. 02332

[21] Appl. No.: 16,297

[22] Filed: Mar. 1, 1979

Related U.S. Application Data

[63] Continuation-in-part of Ser. No. 782,002, Mar. 28, 1977, abandoned, which is a continuation-in-part of Ser. No. 738,750, Nov. 4, 1976, Pat. No. 4,121,110, which is a continuation-in-part of Ser. No. 725,036, Sep. 20, 1976, Pat. No. 4,126,790.

[51] Int. Cl.³ .............................................. G08B 17/10
[52] U.S. Cl. .................................... 340/630; 250/574
[58] Field of Search ............... 340/628, 629, 630, 566; 250/381, 382, 384, 385, 573, 574; 358/174, 177, 179; 455/242, 245; 356/438, 439

[56] References Cited

U.S. PATENT DOCUMENTS

| | | | |
|---|---|---|---|
| 3,155,954 | 11/1964 | Larrick et al. | 340/566 X |
| 3,316,410 | 4/1967 | Meili et al. | 340/630 |
| 3,761,908 | 9/1973 | Gehman | 340/553 |
| 3,778,807 | 12/1973 | Ralston | 340/564 |
| 3,924,252 | 12/1975 | Duston | 340/630 |
| 4,121,110 | 10/1978 | Solomon | 356/439 X |
| 4,126,790 | 11/1978 | Solomon | 250/564 |

*Primary Examiner*—John W. Caldwell, Sr.
*Assistant Examiner*—Daniel Myer
*Attorney, Agent, or Firm*—Wolf, Greenfield & Sacks

[57] ABSTRACT

The smoke detector uses modulation techniques to differentiate within a smoke detection chamber between ambient energy and energy from a transmitting source. A delayed automatic gain control is provided to reduce the effects of slow change of parameters in the detector itself and to provide greater discrimination between smoke which should cause an alarm and smoke resulting from, for example, tobacco. The smoke detector further provides for increased signal-to-noise ratios thus providing for more accurate and precise measurements.

16 Claims, 16 Drawing Figures

FIG. 2
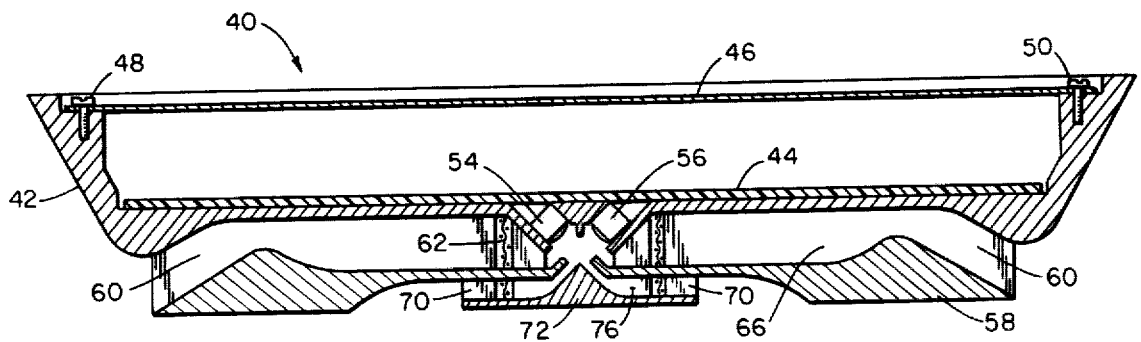
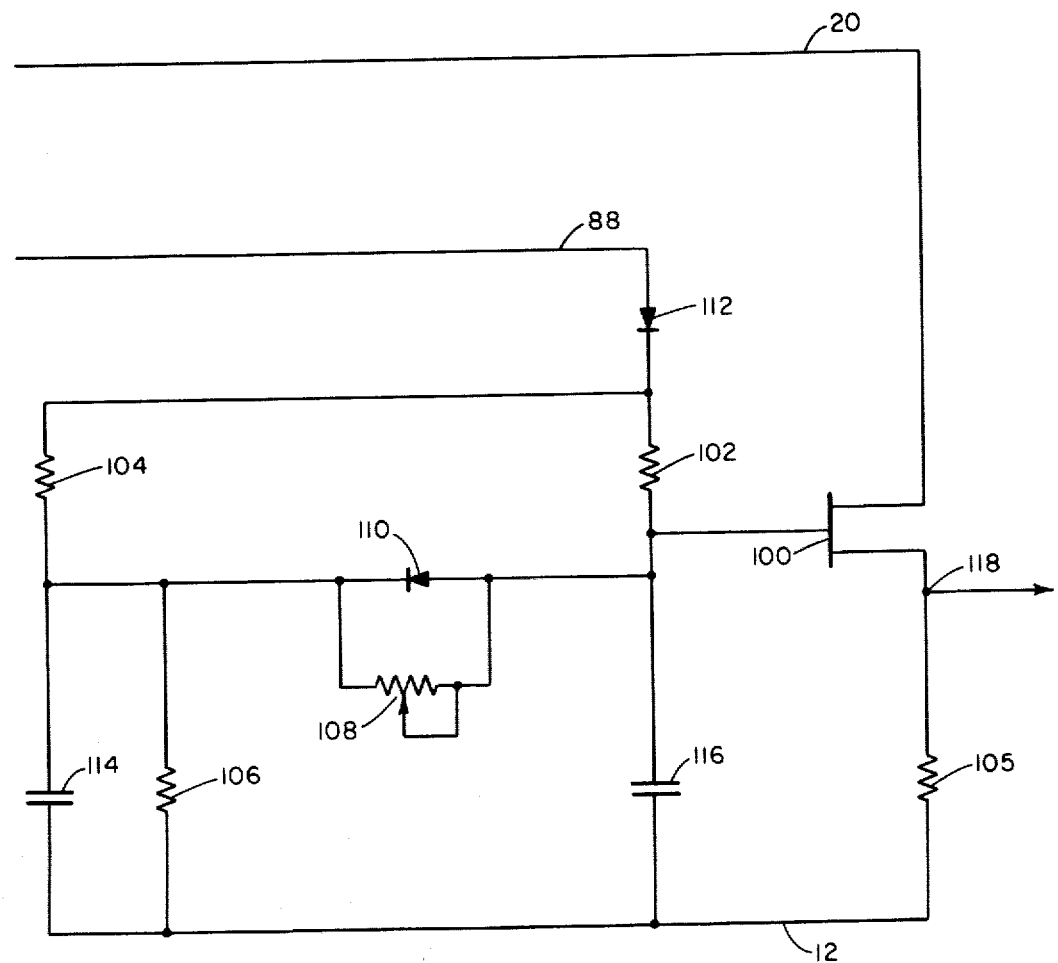
FIG. 3

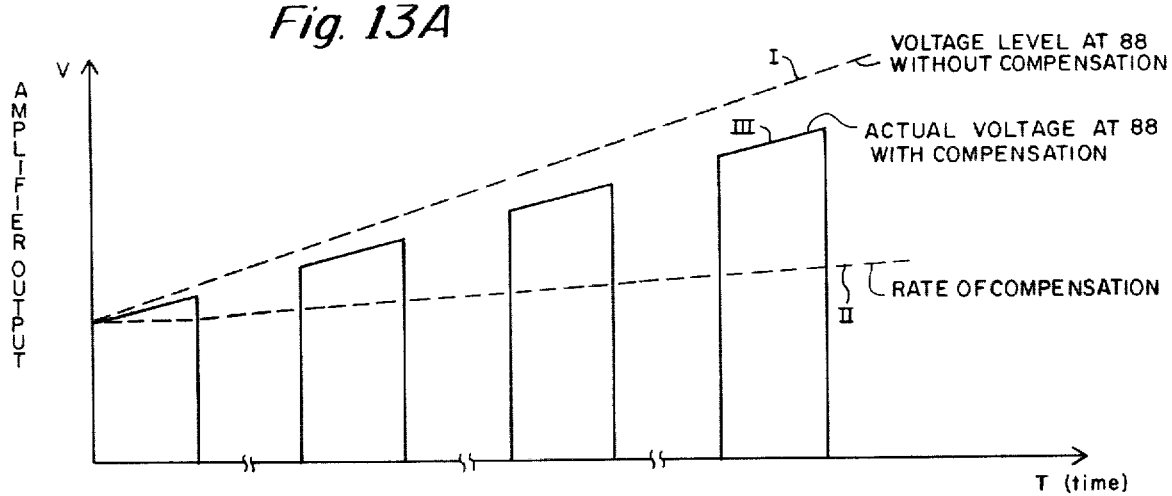
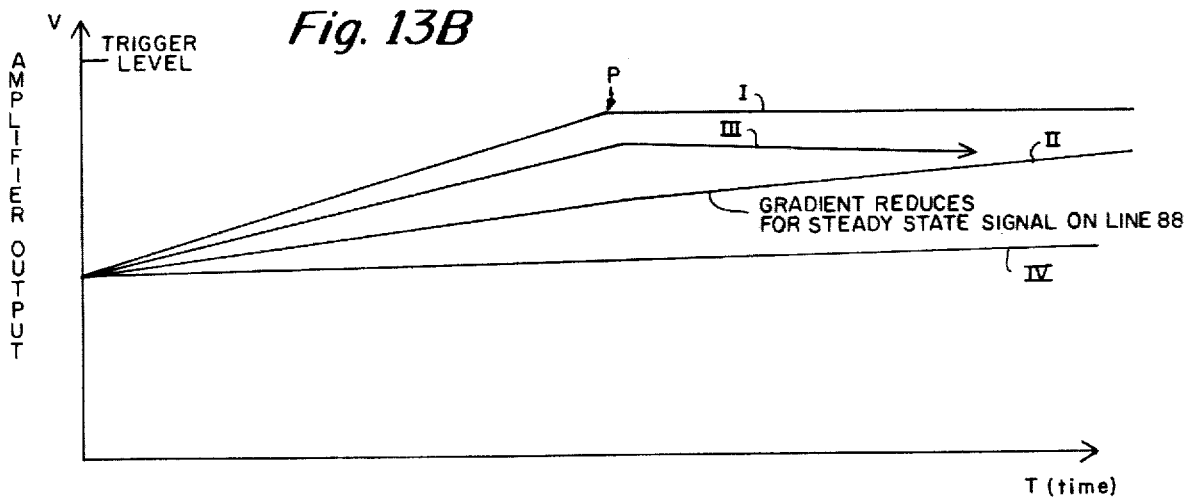
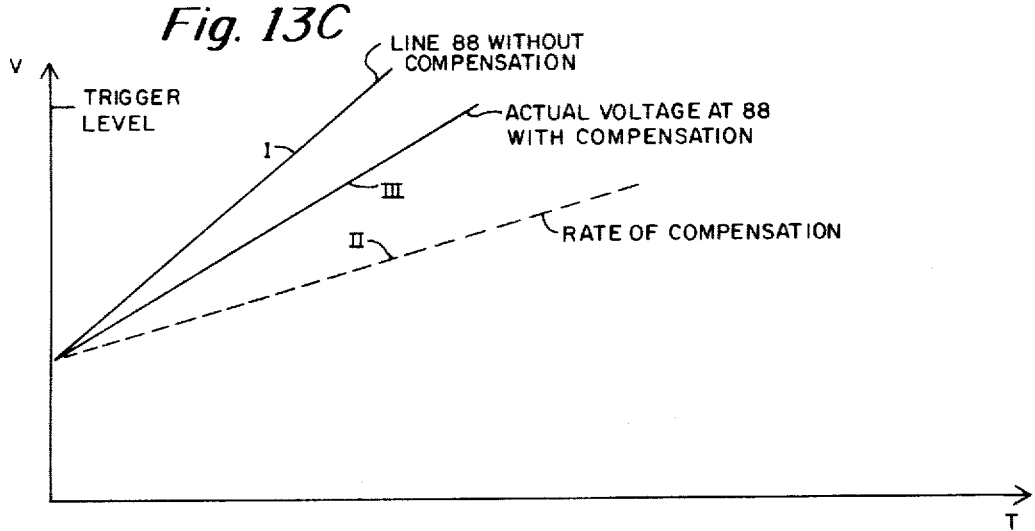

$$\text{VOLTAGE GAIN} = \frac{R_2 + R_3}{R_1}$$

SMOKE DETECTOR

RELATED APPLICATIONS

This is a continuation-in-part of application Ser. No. 782,002, filed Mar. 28, 1977, and now abandoned, which was, in turn, a continuation-in-part of application Ser. No. 725,036 filed Sept. 20, 1976, U.S. Pat. No. 4,126,790 entitled "Strobed Smoke Detector" and of application Ser. No. 738,750 filed Nov. 4, 1976, U.S. Pat. No. 4,121,110 entitled "Optically Biased Smoke Detector".

BACKGROUND OF THE INVENTION

The referenced U.S. Pat. No. 4,126,790 relates to a smoke detector, a salient feature of which is pulsed or strobed operation in which the detection circuitry, with or without the voltage regulator, is operated periodically at a relatively low duty cycle. Energy storage elements are preferably incorporated to build up and hold an electrical charge between operating times. In this manner, power consumption is significantly reduced as is peak or transient current demand.

The referenced U.S. Pat. No. 4,121,110 relates to the optical biasing of an optical smoke detector and to various physical features of the biasing system and its housing which facilitate the passage of smoke into the detection chamber. Various adjustable arrangements of radiant energy source and transducer disclosed therein enhance the effectiveness of the optical biasing and further increase the efficiency of smoke detection.

Thus the goals of lower power consumption and lower transient current demand are met by the strobed smoke detectors described in U.S. Pat. No. 4,126,790 and the goals of greater sensitivity and stability of operation are met by the optically biased photo-optical smoke detectors of U.S. Pat. No. 4,121,110.

As is pointed out in the patent application and referenced patents, the basis of operation of most smoke detectors, either photo-optical or ionization, is the effect of smoke upon the amount of energy received by a transducer from a known energy source. Most commonly, in optical detectors, it is the presence of smoke in a detection chamber which reflects or scatters light not normally incident upon the receiving transducer into the field of view of that receiver, thereby changing the electrical output of the receiving transducer to trigger an alarm. In order to reduce the effects of outside ambient energy, the detection chamber is made "light-tight" whereby smoke, but not light, may enter the chamber by a tortuous path. It would clearly be better if a photo-optical smoke detector could operate with an essentially open structure, relatively immune to ambient energy, into which smoke could flow entirely freely. This would increase the speed at which smoke is detected. It would further be desirable to increase the energy of the source so as to increase the signal-to-noise ratio in order to provide a more reliable, noise-free signal to the alarm circuitry.

While ambient energy in the detection chamber is primarily a problem solely with photo-optical detectors, other problems affecting the sensitivity and maintenance of the detector are common to all smoke detectors. Thus, a self-compensating smoke detector in which sensitivity would be automatically adjusted to remain substantially constant despite aging of components, accumulation of dust particles on exposed elements, drift of components and the like would greatly reduce maintenance efforts and costs and would increase reliability. There are also situations in which a rate-of-rise detection would be useful to advantageously distinguish between slow and rapid changes of smoke density. Finally, constant automatic supervision of the integrity and operability of a smoke detector is of obvious importance as in any safety device. It is with these desiderata that this invention is concerned.

A principle object of the invention is an improved smoke detector into which smoke may flow more freely. Another object is to compensate for ambient energy which may reach the detection chamber. A further object of the invention is to adjust automatically the gain of the smoke detection circuitry to compensate for changes in operating conditions, for example, due to aging or drift, of the components.

A still further object of the invention is a reliable and inexpensive smoke detector which operates with exceedingly low power drain, and in which maintenance is minimal. A further object of the invention is a smoke detector in which available radiant energy within the detection chamber of the apparatus is increased.

Other objects of the invention are a smoke detector responsive to the rate of increase in the smoke level, and a smoke detector having an increased signal-to-noise ratio.

SUMMARY OF THE INVENTION

One of the significant concepts underlying the present invention is modulation of the transmitting device to alter its output in a predetermined manner and a receiving circuit which detects the modulation and is responsive thereto to trigger an alarm when the detected signal exceeds a predetermined threshold. Such modulation may be employed in either continuously operating or pulsed detectors and it may be in the form of frequency modulation, amplitude modulation, or a combination of both.

In a typical photo-optical detector, the light source may be a light-emitting diode (LED) and the receiving transducer may be a photodiode or a phototransistor. If the detector is optically biased according to U.S. Pat. No. 4,121,110, a known and predetermined amount of energy from the source normally reaches the receiving transducer and unless and until smoke is present no additional energy is received. If a detection chamber which is relatively "wide open" to ambient light is used according to the invention, to allow for easy and direct entry of smoke into the chamber and correspondingly fast response to very low concentrations of smoke, then the modulation provides means to distinguish the ambient light from the energy source emissions. Ambient energy, or other energy not modulated in the predetermined manner, reaching the receiving transducer is effectively "stopped" by the demodulator and is ineffective to trigger the alarm. For example, high-pass filters may be incorporated in the received circuit if rapid ambient light changes are anticipated, as, for example, from fluorescent or other common types of light systems.

Automatic gain control circuits using a time delay may also be incorporated in the receiver circuitry to provide for rate-of-rise smoke detection to distinguish between low and rapid changes in smoke concentration and therefore provide the ability to prevent false alarms as when tobacco smoke is temporarily present. The same circuitry can be adjusted to provide sensitivity adjustment as well as general detector supervision, all as explained in greater detail hereinbelow.

In one aspect, a smoke detector is provided which has a detection chamber having at least one path by which surrounding air may pass into the chamber, a radiant energy source for emitting in response to an energizing signal a known spectral radiation in the chamber, a transducer positioned in commuication with the chamber for providing a signal output response to any radiation impinging upon a radiation sensitive portion of the transducer, means for providing the energizing signal to the radiation energy source, amplification means responsive to the signal output of the transducer for providing an electrical signal output indicative of the amplitude of radiant energy sensed by the transducer, and an alarm means operable when an output of the amplifications means exceeds a predetermined value. The invention features the improvement wherein the paths are constructed so that air passes more freely into the chamber by allowing a portion of the ambient radiation outside the chamber to reach the interior of the chamber. The invention further features a modulator for varying the energy output of the radiant source according to a predetermined pattern by varying the energizing signal and a circuit having a demodulator connected in circuit arrangement with the amplification means for detecting and measuring that portion of the transducer signal output corresponding to the predetermined pattern, the alarm means being responsive to the output of the circuit arrangement.

In preferred embodiments of the invention, the detection circuit is strobed so that it is operative only during predetermined time durations.

In other aspects of the invention, there is featured a smoke detection chamber for an optical smoke detector comprising a source of radiant energy, a transducer sensitive to the radiant energy, the source being substantially at a point source of energy and being centrally mounted in a plane of a flat reflecting surface in the chamber. The chamber has a second reflecting surface aligned with and spaced from the flat reflecting surface and the source whereby substantially the entire energy emitted by the source and striking said second surface travels at least twice the distance between the first and second surfaces before being absorbed. The transducer has in its field of view a substantial portion of the space between the first and second reflecting surfaces. In specific embodiments, the second surface may be concave, parabolic, spherical, or elliptical.

In yet another aspect of the invention, there is provided a smoke detector having circuitry for detecting the product of combustion within a detection chamber open to the passage of air from outside the detector featuring means to monitor a selected electrical parameter of the circuitry for providing a delayed control signal in response to changes in the value of the monitored parameter and gain control circuitry to connect the control signal from the monitoring circuit to change the gain of the detection circuitry of the smoke detector.

In accordance with another feature of the present invention there is provided a testing means and method for accurately calibrating a detector and this feature is described herein in connection with the testing of an optically biased detector. This testing is accomplished by means of a manually operated plunger or the like for operating a movable member associated with a slotted barrier. In the normal position of the movable member, there is relatively slight optical biasing. However, when the plunger operates the movable member there is a predictable amount of extra illumination impinging upon the detector to simulate a certain required percentage of smoke. When the plunger is released, the movable member is biased back to its original position.

In accordance with another feature of the invention the gain compensation is facilitated by means of incremental control of a reference or trigger level input of a comparator or the like.

DESCRIPTION OF THE DRAWINGS

Other objects, features and advantages of the invention will appear from the following description of a preferred embodiment of the invention taken together with the drawings in which:

FIG. 2 is a cross-sectional view of a typical smoke detector according to the invention;

FIG. 3 is a preferred embodiment of the delayed automatic gain control circuit according to the invention;

FIGS. 13A, B and C show representative waveforms associated with the delayed gain control feature of this invention;

DESCRIPTION OF A PREFERRED EMBODIMENT

As discussed above, there are several different types of smoke detectors. They can generally be divided into two classes, those which depend upon scatter or obscuration of radiant energy usually in the visible or infrared bands, and those which depend upon the flow of current from a source of ionized particles, typically americium. In either case, the receiving transducer provides an electrical output signal which, after processing, is compared to a predetermined value or threshold. If the processed signal exceeds the predetermined value, an alarm is triggered and latched.

For ease of discussion, the following description is directed to an optical type smoke detector, and in particular, an optical, scatter-type smoke detector which detects the presence of smoke particles in a detection chamber. Nevertheless, several features of the invention are also applicable to ionization smoke detectors and obscuration optical detectors. They shall not be discussed directly; however, when applicable, a reference to these other detectors will be made.

Figure 1:
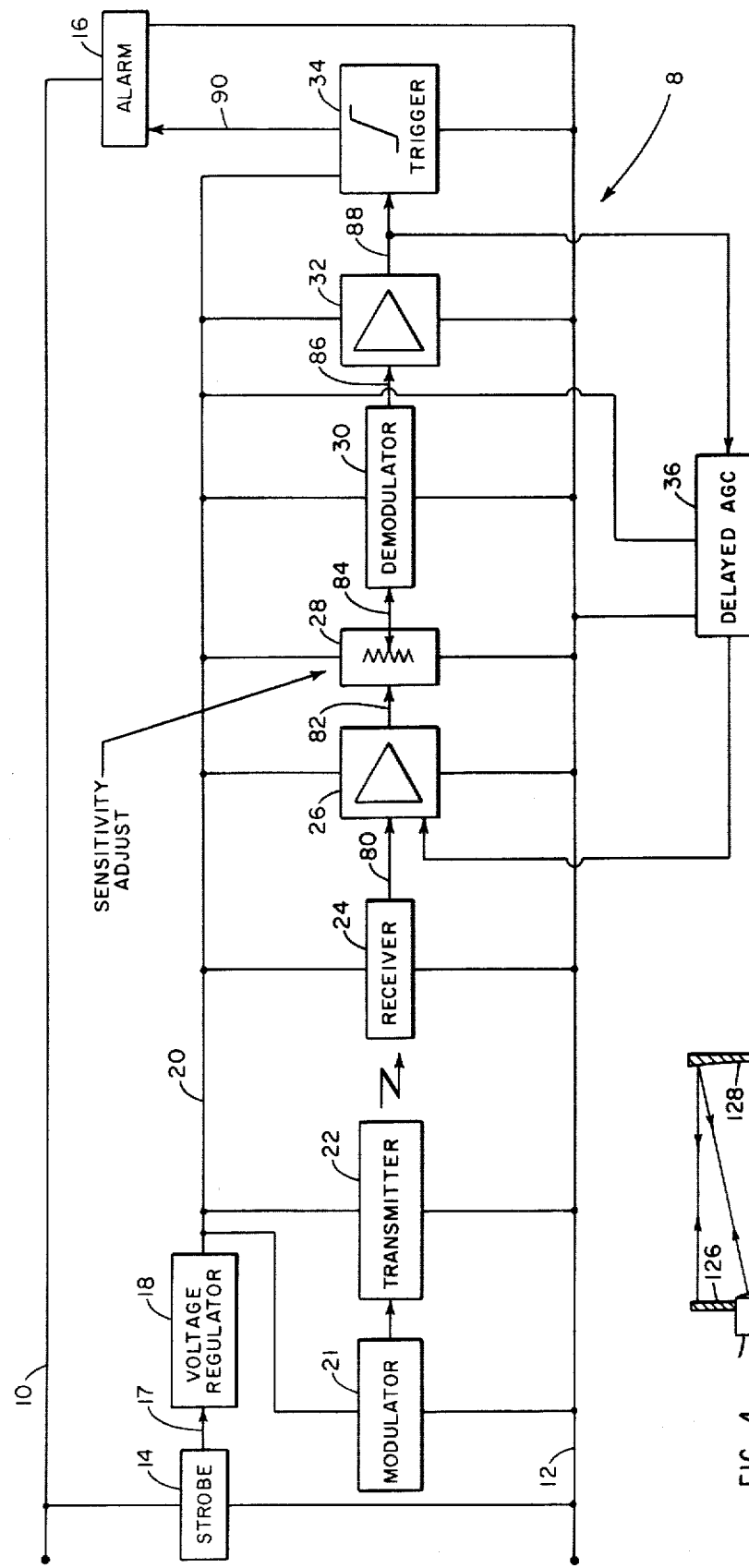
FIG. 1 is a block diagram of the electrical components of the smoke detector according to a preferred embodiment of the invention.

Referring to FIG. 1, a photo-optical smoke detector according to the invention has an electrical circuit 8 which is powered over lines 10 and 12 from a power source (not shown), for example, a battery or a direct current generated voltage. A strobe circuit 14 and an alarm circuit 16 are connected directly across the supply voltage over lines 10, 12. As disclosed in my U.S. Pat. No. 4,126,790, in the preferred embodiment of the invention, the remaining circuitry is operated at a low duty cycle, being connected across the output of strobe circuit 14.

The voltage output of strobe circuit 14, over line 17, is regulated by a voltage regulator circuit 18 (not usually required if the supply voltage is from a battery). The regulated output voltage from voltage regulator 18 over line 20 supplies the remainder of the smoke detection circuitry. Connected across lines 20 and 12 is the detection circuit comprising a modulation circuit 21, a transmitter circuit 22, a receiver circuit 24, an amplifier circuit 26, a sensitivity adjustment 28, a demodulation circuit 30, a second amplifier 32, a threshold triggering circuit 34, and in the preferred embodiment a delayed automatic gain control circuit 36.

Referring to FIG. 2, a typical photo-optical smoke detector 40 using the scattered energy principle, may be of any desired shape and is shown as round. It may be constructed of molded plastic, formed metal, or any other convenient and inexpensive materials. Preferably, a well is formed in the upper portion and some conventional means (not shown) is provided to permit attachment of the detector to a ceiling or wall. The well contains electrical components which are assembled and mounted on a printed circuit card 44. A cover 46 is held in place by screws 48 and 50. Provision for entry of a connector (not shown) may be made by forming an opening in the housing 42 or in the cover 46. Other openings may also similarly be formed to accommodate potentiometer controls or other adjustment devices.

The circuit card 44 seals off and separates the well of the housing from the smoke detection portions lying beneath the circuit card. A radiant energy source 54 which may be a light emitting diode (LED) and a corresponding transducer 56, which may be a phototransistor, both with suitable optics as explained in my U.S. Pat. No. 4,126,790, are plugged into the lower surface of the circuit card 44. The smoke detection portions of the device are defined by the bottom of the well, including the circuit card 44 and the upper surface of a cowl 58. The two facing surfaces are matched and smoothly contoured to provide an unimpeded passage 60 for air and smoke to gain free access to the optical detection chamber which is circumferentially limited approximately by a mesh cylinder 62 which serves as an insect shield. The passage 60 has no abrupt barriers or tortuous paths to prevent the free entry of smoke particles. In the optical chamber, a number of fins or vanes 66 are radially disposed in the passage 60 to further concentrate and funnel the flow of air and smoke, especially horizontal flow, in defined paths, toward the optical chamber through the passage 60. These may be formed upon the upper surface of the cowl 58 or upon the lower surface of the well housing 42.

The bottom of the optical chamber is also open and a passage 70, designed especially for vertical air and smoke flow, is formed between the upper surface of a relatively small central deflector 72 and the lower central surface of cowl 58. The central deflector 72 has a tapered upper surface conforming to the confronting lower cowl surface and the passage 70 serves to concentrate and funnel air and smoke flow to the optical chamber. Still further concentration is achieved by the formation of tapered radiant fins 76 which may extend along the same lines as fins 66. As in the case of passage 60, no abrupt barriers or tortuous paths exist to inhibit easy entry of smoke particles.

The paths defined in passages 60 and 70, by providing for the relatively free movement and entry of air and smoke particles, may also inadvertently or purposely provide for the admission of ambient energy into the optical detection chamber. According to the invention, the admission of ambient energy into the optical detection chamber. According to the invention, the admission of ambient energy into the detection chamber does not adversely effect the satisfactory operation of the smoke detector. This is a radical departure from the teachings of earlier photo-optical smoke detectors.

Referring again to FIG. 1, strobe circuit 14 in the preferred embodiment operates at a 0.4% duty cycle, a 20 millisecond pulse every five seconds. The transmitter circuitry 22 may be of any type and in its simplest form includes the source of radiant energy 54 in series with a current limiting resistor. If the modulating circuit 21, during the strobe time, where not connected to transmitting circuit 22, the energy source would be "on" during the entire strobe time. Thus, neglecting the effect of modulating circuit 21, the output of the source 54 is typically at a constant level during the strobe time. The modulating circuit 21 is provided to vary the output of the radiant energy source 54 during the strobe time according to a predetermined pattern. The modulation may be any convenient type. In general, any variation of the output of source 54 which provides a recognizable signal pattern at the receiver circuit may be used. Thus, amplitude modulation, frequency modulation, or a combination of the two may be used. One typical and preferred modulation circuit comprises a high frequency astable multivibrator connected to periodically interrupt, for example through a gate circuit, the current through source 54. A typical operating frequency might be 40 KHz. The construction of other modulators will not be detailed further and are well known in the art.

The receiver circuit may typically be an appropriately connected transducer 56, for example a phototransistor, which provides an output signal over line 80 whose current is a function of the total amount of energy received at its sensitive surface. Thus, the signal on line 80 is a function of both the ambient energy (energy received through passages 60 and 70) and any energy received from the energy source 54. The output of the receiver circuit 24 is amplified by amplifier 26 and the output of amplifier 26 over line 82 is, in this particular embodiment, attenuated by sensitivity adjustment 28 which may be, for example, a potentiometer. In other embodiments of the invention, sensitivity adjustment 28 may not be needed or may be incorporated into amplifier 26.

As noted, the output of receiver circuit 24, and hence of adjustment 28 generally has two components, a low frequency or perhaps DC component representing ambient energy, and a component representative of a modulated output of source 54. In order to separate the two components and hence eliminate the effects of ambient energy, demodulator 30 is provided. The output signal from sensitivity adjustment 28 over lline 84 is demodulated by demodulator 30. The demodulator is matched to the type of modulation provided at modulator 21. Thus, in the described example where a 40 KHz, 100% AM modulator is used, the demodulator may typically be a highpass or bandpass filter network followed by, for example, full-wave rectification and a smoothing circuit. The design of these circuits is well known to those skilled in the art. The output of demodulating circuit 30, over line 86, lacks information relating to the ambient energy portion of the signal from receiver 24. When other patterns of modulation are used, the demodulating circuit 30 is matched thereto as is well known in the art. In every instance the output of demodulator 30 has a one-to-one relationship to the energy incident on transducer 56 from source 54.

In this preferred embodiment, the output of demodulator 30 is buffered by amplifier 32. The buffered output signal over line 88 is compared in the trigger circuit 34, which may be, for example, a Schmitt trigger, with a predetermined level or value. If the outpt signal of amplifier 32 exceeds the predetermined value, the trigger circuit 34 initiates an alarm condition by a signal over line 90 and the alarm circuit 16, which is connected directly to the power supply, latches and warns, for example through an audible signal device, that the smoke threshold has been exceeded.

Modulation of the energizing signal applied to the radiant source 54 thus eliminates the effect of ambient energy in the detection chamber. Stated otherwise, steady ambient light is ineffective because the amplifiers are AC-coupled. Fluctuating ambient light as, for example, that emanating from incandescent or other filamentary sources (60 Hz) or fluorescent sources (up to 10 KHz) is ineffective because the discriminator or demodulator, as the case may be, serves as a filter.

If, however, the energy output from the radiant source decreases, for example, either due to aging or dust falling upon the source 54 or transducer 56, causing the gain of the detector circuit to fall, a high smoke level will be required before alarm 16 is triggered. This potentially results in unsafe operating conditions and further increases detector maintenance. Consequently, according to the invention, delayed automatic gain control (delayed AGC) 36 is provided to automatically compensate for slow changes in operating conditions. In the preferred embodiment, the delayed AGC 36 is placed in a feedback loop configuration to control the gain of amplifier 26 so that the nominal voltage on line 86 is maintained at a constant value. In other embodiments of smoke detector circuits, e.g., ionization detectors, obscuration detectors, or detectors not employing the advantage of easy access to the smoke detection chamber (and hence not having a need for modulating the source energy output) the delayed AGC may be connected in other configurations to change the gain of the system. For example, the parameter being monitored may be the output of the transducer and the delayed AGC may change the gain of the transducer.

While many types of automatic gain control circuits are well known and may be adapted for use generally in smoke detection circuitry, certain requirements must be met with respect to a strobed circuit arrangement which do not exist in conventional continuously operating detectors and which require special attention. In those instances where the detector circuit is not strobed, the primary specifications for the automatic gain control circuit are to maintain a selected voltage at a known value and to delay the correction by a fixed time, so that relatively fast changes, for example, a voltage build-up due to the presence of smoke, will not be completely corrected, thus preventing triggering of the alarm signal. Consequently, for a continuously operated circuit, a lowpass filter in series with a control circuit will suffice to maintain a selected parameter within specified limits while allowing an alarm condition due to rising smoke density to trigger the alarm.

In the strobed smoke detector circuit, the problem is more severe since typically the duty cycle is very low. Consequently, a typical lowpass filter circuit is inadequate to discriminate between slow change and fast change at a typical strobe rate of five seconds.

Referring to FIG. 3, a delayed automatic gain control circuit according to the preferred embodiment includes a field effect transistor 100 connected as a source follower, resistors 102, 104, 105, 106, a variable resistor 108, diodes 110 and 112 and capacitors 114 and 116. Typically resistors 102, 105, and 106 have relatively high resistance values and resistor 104 has a relatively low resistance value.

The change of voltage at the source 118 of the field effect transistor is used to increase or decrease the gain of amplifier 26. If the voltage which is being monitored, the voltage on line 88 in the preferred embodiment, remains constant when strobed, then the voltage across capacitors 114 and 116 also remain substantially constant. During the strobe time, therefore, the gain of amplifier 26 will remain constant since the source voltage across resistor 105 remains constant.

If, however, the output from over line 88 decreases, for example, because dust has been deposited on either the transmitting source or the receiving transducer, the gain of amplifier 26 is adjusted as follows. Prior to compensation from the delayed AGC, the output of amplifier 32 over line 88 decreases since the energy received by the transducer decreases, and hence a greater amount of smoke is required to trigger the alarm. As a result of the lower voltage on line 88, capacitor 116 will slowly discharge through diode 110 and resistor 106 to a lower voltage value. As capacitor 116 discharges, the voltage across resistor 105 decreases which causes the gain of amplifier 26, in this embodiment, to increase. The resistance values are sufficient to substantially readjust the charge of capacitor 116 (and capacitor 114) in a few strobe cycles (five seconds). On the next strobe pulse, the amplifier 26 will have a slightly higher gain. The higher gain increases the voltage level on line 88 and causes the voltage across capacitor 114 to change relatively quickly toward that new voltage level. During the off-time between strobe pulses, capacitor 114, now at a higher voltage than capacitor 116, discharges through variable resistor 108 into capacitor 116. Then, during the next on-time, because the value of voltage across capacitor 116 is slightly higher, the gain of amplifier 26 is decreased somewhat. Through a plurality of strobe cycles, a normalized gain is achieved. The proper selection of circuit component values provides the flexibility to choose the response time of the circuit. Thus if there is a large change in voltage across line 88, corresponding to the detection of smoke, the delayed AGC does not respond fast enough to prevent the alarm from triggering. Typical values of the components are:

Resistor 102 1 Megohms;
Resistor 104 10 K ohms;
Resistor 105 10 K ohms;
Resistor 106 20 Megohms;
Potentiometer 108 10 Megohms;
Capacitor 114 10 uf;
Capacitor 116 1.0 uf.

This choice of values also allows the smoke detector to operate as a rate-of-rise detector (other component value choices will of course produce similar results with this circuit configuration). Thus if the signal on line 88 increases at or below a determinable rate, the delayed AGC can and will correct quickly enough to prevent the alarm from triggering. This provides the smoke detector with immunity to false alarms due, e.g., from tobacco smoke. In the preferred embodiment, using the component values noted above, a maximum rate of increase at the output of amplifier 88 would be 0.1 volts/second. An increase greater than 0.1 volts/second would, after several strobe cycles, cause the alarm to trigger.

The delayed AGC in the circuit configuration of FIG. 1, is not effected by changes in ambient light. Thus, in the preferred embodiment, the delayed AGC is connected after the demodulator and is therefore not responsive to changes in ambient energy or light. It is only responsive to changes which effect the modulated energy from source 54. It is therefore important in the embodiment of FIG. 1 that at least a portion of the output of source 54 always be received by transducer 56, whether or not smoke is present, so that a stable operating reference voltage is maintained on line 88. This can conveniently be done using optical biasing which has been described heretofore in my U.S. Pat. No. 4,121,110.

Figure 4:
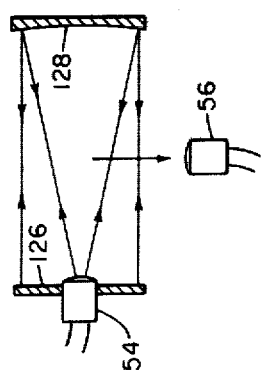
FIG. 4 is a partially schematic and idealized view of an energy source illustrating energy transmission patterns from said source.

In conjunction with the modulation and delayed AGC of the present invention, the signal-to-noise may be improved by increasing the emitted light in the detection chamber. A second approach is shown in FIG. 4 where, for convenience, the energy source 54 and the receiving transducer 56 are schematically shown at right angles to one another. They may be arranged, and preferably are arranged in other configurations, for example, as in FIG. 3 of my issued U.S. Pat. No. 4,121,110. The energy source is preferably an LED and is mounted centrally in a flat mirror surface 126 and operates essentially as a point source of light which has a generally conical radiation pattern as shown, and which falls upon a second mirror 128. The shape of the mirrors need not be limited to the planar, although two confronting planar mirrors will suffice. Other shapes such as parabolic, spherical, elliptical, or other concave shapes may be used and in FIG. 4 what is actually shown is a concave mirror 128 disposed axially to the source 24. With the source at the focal point of the mirror 128, light is reflected back toward the source 24 in generally parallel beams by the mirror 128 in the first instance. The parallel beams stroke the plane mirror 126 and are reflected back along the same path and thence, from the concave mirror, back to the source and the cycle repeats. As a practical matter, absorption does occur but the overall effect is to greatly magnify available light in the optical paths. Similar results are obtained with other mirror shape combinations. Thus, not only is the amount of light that will reach the receiving transducer greatly increased when reflecting smoke particles are present, there is also available if desired, sufficient light from scattering effects for the optical biasing function of U.S. Pat. No. 4,121,110. The greatly increased light (or energy in the general case) thus increases the signal-to-noise ratio of the system.

Figure 5:
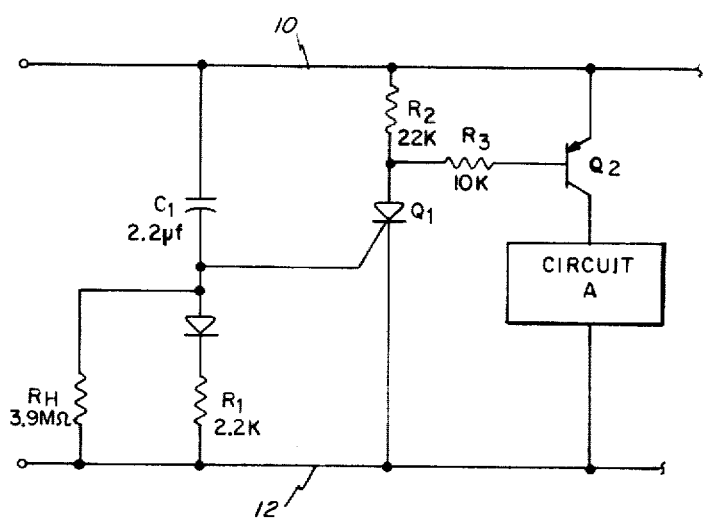
FIG. 5 shows a specific circuit arrangement for the strobe circuit 14 shown in FIG. 1.

FIG. 5 is a specific circuit diagram of one embodiment of the strobe 14 shown in FIG. 1. This circuit may find particular use in connection with power from a battery source in which case the voltage regulator circuit 18 of FIG. 1 may not be necessary. In FIG. 5 there are shown the basic supply buses 10 and 12 also identified in FIG. 1. FIG. 5 also describes in a block the circuit A which in effect represents the rest of the circuitry shown in FIG. 1 receiving signals from the strobe line 20 of FIG. 1. In connection with the present invention the strobe circuit is used, not only in conjunction with the transmitter portion, but also in connection with the receiver portion and the associated delayed gain control and demodulation.

In FIG. 5 there is shown a transistor Q2 which is essentially the output strobe transistor, SCR Q1, capacitor C and associated resistors R1, R2, R3 and RH. Before power is turned on at lines 10 and 12 the capacitor C is discharged. Once power is applied to lines 10 and 12 the capacitor C functions as an immediate short circuit and the SCR Q1 fires assuming that there is sufficient gate current into the gate thereof. However, as the capacitor C charges toward the supply voltage on line 10, the impedance of the capacitor becomes quite large, especially in comparison with the resistor value of resistor R1. Thus, the current into the gate of SCR Q1 is reduced below the required firing level. The SCR Q1 thus turns off because the values of resistors R2 and R3 are chosen to be sufficiently high so that the current to the SCR is below the sustaining current necessary for maintaining conduction thereof. The capacitor C then discharges by way of resistor RH to give as long an "off" time as desired. When the SCR Q1 is conducting it maintains the transistor Q2 on thus gating the circuit A. One advantage of the circuit of FIG. 5 is that little current is drawn with the exception of the current demand which is predominantly only during the "on" period of the strobe circuit. As previously mentioned, this circuit may operate at a 0.4% duty cycle with a 20 millisecond pulse every 5 seconds.

While FIG. 5 shows one means of generating a strobe signal (strobe line 20 of FIG. 1), there are other alternative embodiments such as an embodiment employing a relaxation oscillator. In this connection, reference is made to FIG. 6 which shows such a strobe circuit and also a regulator in connection therewith. The circuit of FIG. 6 employs a programmable uni-junction transistor Q1 from which the strobe pulse is obtained. This circuit is also characterized by a reduced current consumption by gating the discharge path of the capacitor C1 for only the "on" period of the circuit. The strobe circuit of FIG. 6, in addition to the transistor Q1, which essentially replaces the SCR Q1 of FIG. 5, also includes transistors Q2 and Q3. The regulator employs transistor Q4 along with capacitor C2 and resistor RC. The transistor Q2 of FIG. 6 functions substantially the same as transistor Q2 of FIG. 5 as the basic output strobe transistor coupling to the circuit A representative of the circuitry of FIG. 1 coupling from the strobe line 20.

Figure 6:
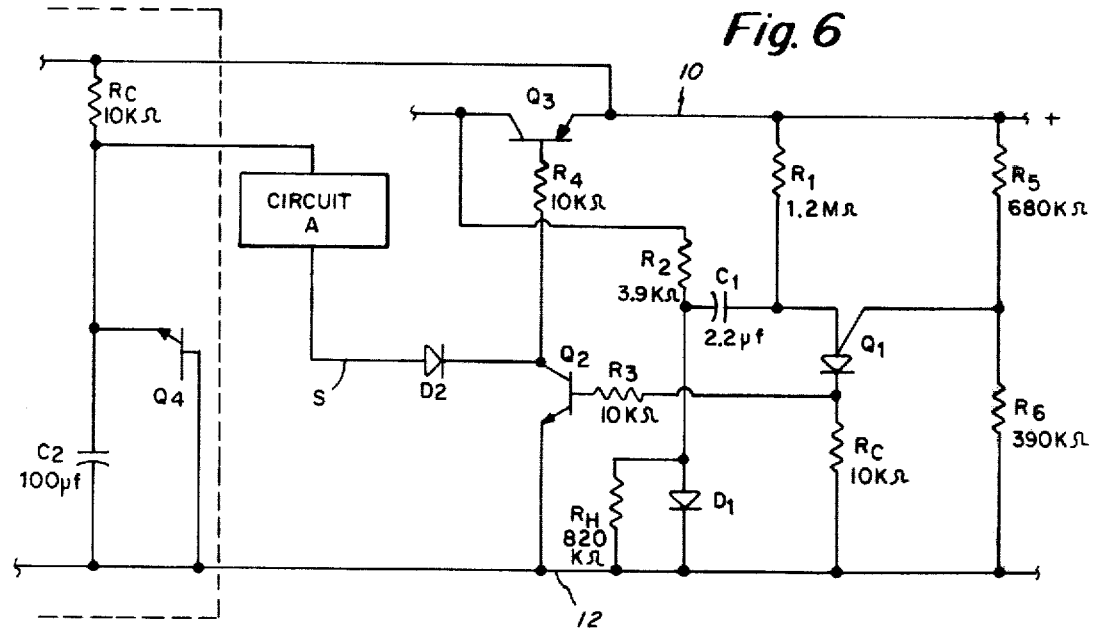
FIG. 6 shows an alternate embodiment for a strobe circuit including a regulator and showing in block form all of the other circuitry that receives the strobe signal.

In FIG. 6 the transistor Q1 is normally non-conductive because the voltage at the anode thereof is lower than at the gate input. The gate input to the transistor is from the common point between resistors R5 and R6. The capacitor C1 will charge by way of resistor R1 and the diode D1. When the capacitor C1 has charged to a sufficient voltage, then when transistor Q1 fires the circuitry including resistors R3 and RC cause transistor Q2 to turn on. The transistor Q2 has associated therewith transistors Q3. When transistor Q2 turns on, transistor Q3 also becomes conductive thereby causing capacitor C1 to discharge rapidly through relatively low value resistor R2. If the transistors Q3 were not employed and resistor R2 was instead connected directly to line 10 then a high quiescent current would be provided which would be disadvantageous in that there would be a continuous low on the supply rail. In the embodiment of FIG. 6 the relatively long "off period" is settable by means of at least the selection of the value of capacitor C1. The capacitor C1 is in a charged mode during this "off period".

FIG. 6 also shows the output diode D2 coupling to the strobe line S (line 20, FIG. 1) which in turn connects to the circuit A. The other side of the circuit A couples to the regulator which comprises resistor RC, capacitor C2 and transistor Q4. When transistor Q2 of the strobe circuit is in its "on" cycle, the capacitor C2 discharges into the circuit A. The resistor RC and transistor Q4 form the basic regulator with the transistor Q4 being connected as a base-emitter reverse biased diode having a breakdown in the region of 6-7 volts. The transistor of diode Q4 functions as a shunt regulator. The resistor RC has a relatively high value and thus there is very little quiescent drainage from the regulator. The capacitor C2 is in effect a reservoir capacitor. My U.S. Pat. No. 4,126,790 discloses the use of such a reservoir capacitor which allows for a very high value series resistance RC to thus reduce the quiescent current.

Figure 7:
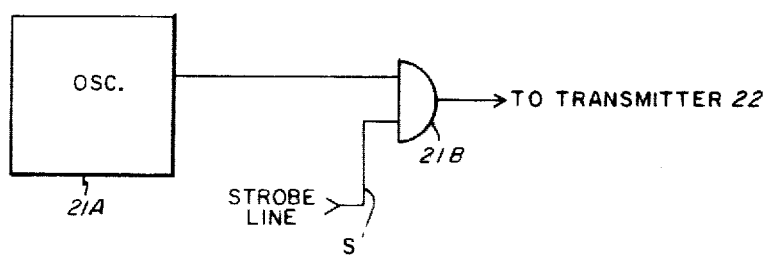
FIG. 7 shows a very simple arrangement for a modulator using a predetermined frequency generator for modulation.

As indicated previously, many different types of modulation may be employed including amplitude modulation, frequency modulation or other types. FIG. 7 shows a very simple arrangement including an oscillator 21A and a gate 21B. The oscillator 21A may also be referred to as a high frequency astable multivibrator referred to previously. The gate 21B is for gating the output of the oscillator. The output of the gate 21B couples to the transmitter 22. The gates 21B is strobed from the strobe line S, for example.

There are also many commercially available integrated circuits such as one made by Rohm Corporation having an office in Irvine, California. For example, the modulating can be provided by an arrangement such as the one shown in FIG. 7 while the demodulation can be provided by a Rohm circuit XR-567 which is a tone decoder. Another available circuit is a Rohm XR-210 modulator/demodulator. In this connection reference is also made to U.S. Pat. Nos. 3,761,908 and 3,778,807 which show modulation/demodulation techniques. For example, in U.S. Pat. No. 3,761,908 the modulation is provided by the use of an astable multivibrator and the demodulation involves the use of a filter circuit.

Figure 8:
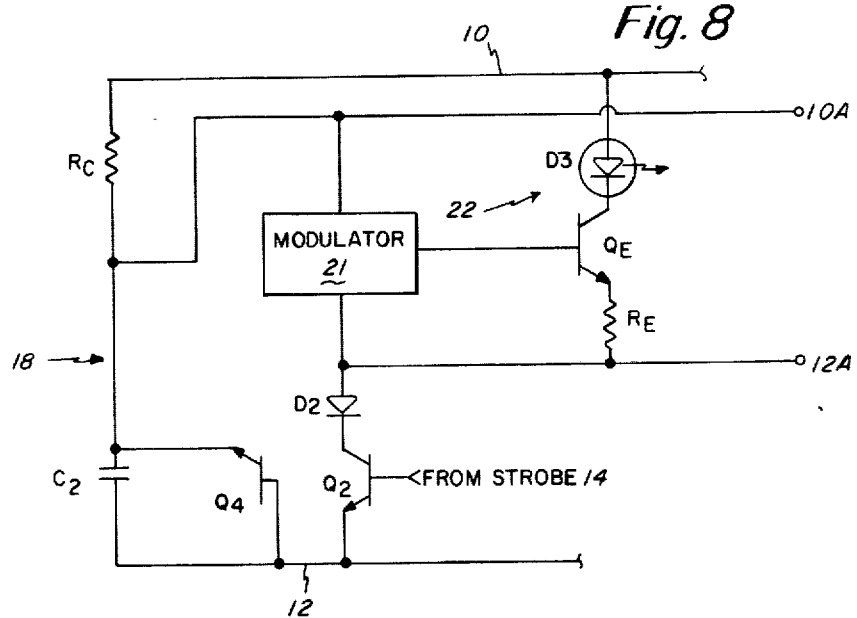
FIG. 8 is a specific circuit diagram showing the strobing, modulation and light source transmitter that is modulated therefrom.

FIG. 8 shows one form of a modulator 21, in combination with the transmitter 22, regulator 18 and the strobe transistor Q2. The operation of the transistor Q2 along with the regulator has been described previously in connection with FIG. 6. The modulator 21 shown in FIG. 8 could be the arrangement shown in FIG. 7 wherein the output from the regulator at the common point between the resistor RC and capacitor C2 couples to the oscillator 21A for operation thereof. In this arrangement, the other input to the modulator 21 could be from the strobe line S shown in FIG. 8 as taken from the anode of diode D2. The output of the modulator 21 shown in FIG. 8 would be taken from the output of gate 21B of FIG. 7. Alternatively, other modulator circuits could be used as described previously or as described in the U.S. Patent referred to hereinbefore.

The output of the modulator 21 shown in FIG. 8 couples to transistor QE. The transistor QE along with resistor RE form a constant current source for the light emitting diode D3. Thus, if the modulator 21 includes an oscillator such as the oscillator 21A of FIG. 7 operating, for example, at 40 KHz, then the transistor QE is also modulated at that frequency, as is the light emitting diode D3. The light, either visible or invisible, is either modulated or coded by the drive from the modulator 21. In any even, the duration of the modulation is quite short controlled by the gating of the transistor Q2 from the strobe 14. As mentioned previously, this gating may be at a duty cycle of 0.4% with a 20 millisecond pulse every 5 seconds. In FIG. 8 the lines 10A and 12A may represent strobe lines usable with other portions of the system including the receiver portion.

Figure 9:
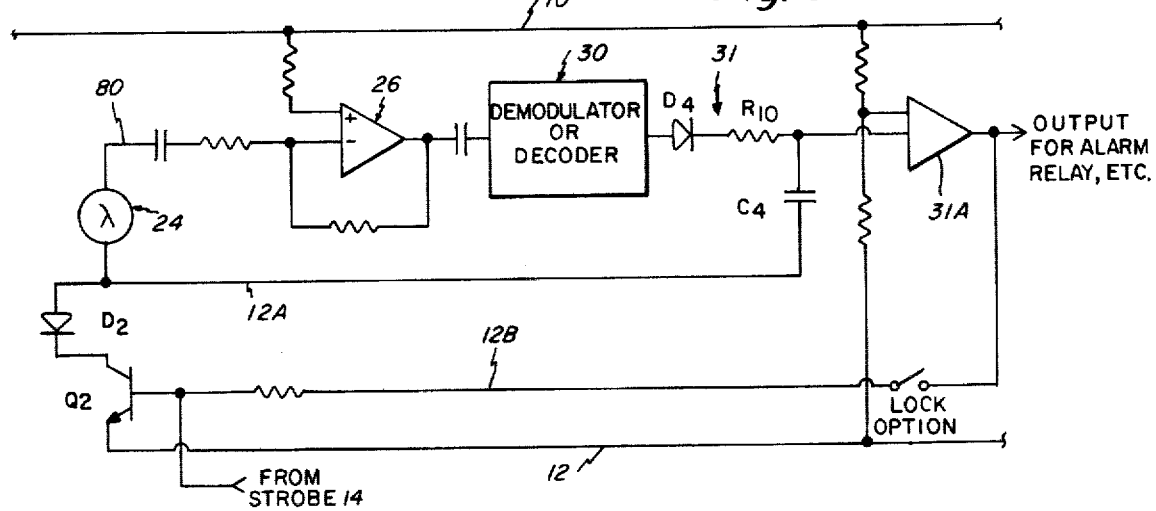
FIG. 9 is a specific circuit arrangement for the receiver portion of the system showing again the strobe transistor and the use of a known integrated circuit demodulator or decoder.
Figure 10:
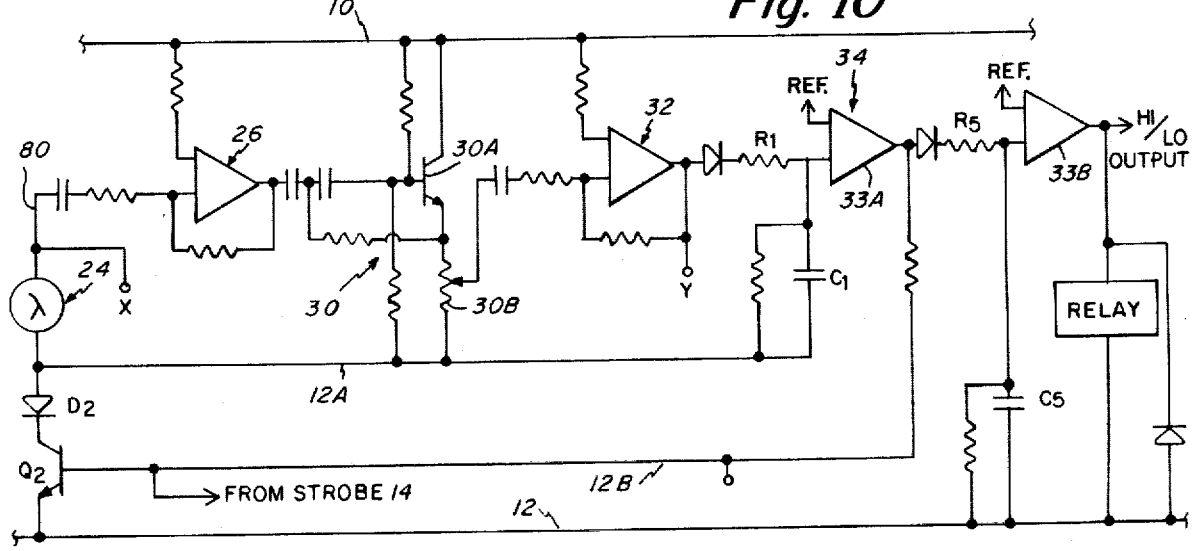
FIG. 10 shows a circuit arrangement similar to the one shown in FIG. 9 employing as a demodulator a filter circuit.

The receiver portion of the system is shown in two separate embodiments in FIGS. 9 and 10. The first embodiment in FIG. 9 is for use in association with a corresponding modulator. The second embodiment of FIG. 10 is for use with a transmitter including a pulse generator or oscillator. In fact, a circuit like the one shown in FIG. 5 could be used for a pulse generator as the modulator in connection with the arrangement of FIG. 10. Such a pulse generator would operate at a relatively high frequency in comparison with the basic strobe frequency providing possibly a single, but preferably multiple pulses during the time the transistor Q2 is gated into conduction.

FIG. 9 shows the strobe transistor Q2, diode D2, the strobe line 12A, the receiver transducer 24, amplifier 26, and demodulator or decoder 30. The receiver 24 is shown as a photo-transistor which provides an output signal over line 80 whose current is a function of the total amount of energy received at the sensitive surface of the photo-transistor 24. However, it is noted that the photo-transistor 24 is operated on a strobed basis from the line 12A by way of diode D2 from transistor Q2. The strobe line 12A also couples to an integrator 31 which may be provided. The integrator 31 includes an R-C circuit. The operation of this integrator requires charging of the capacitor C4 to a predetermined level as discussed hereinafter.

In FIG. 9 there is shown one amplifier stage 26, however, and as many cascaded stages as might be required in a particular application may be used. The amplifier is a typical operational amplifier having associated resistors. For example, this may be an LM 3900 device. Similarly, the output comparator 31A may be an LM 3900 device. The comparator 31A may also be an analog to digital device such as a TI 489. As mentioned previously the demodulator or decoder 30 may be a known integrated circuit such as a Rohm XR-567 tone decoder. Also, reference is made to U.S. Pat. No. 3,778,807 which shows the use of a demodulator. As indicated previously the demodulator 30 is of course tied in with whatever modulation scheme is used at the receiver end of the system. The important aspect is that whatever modulation is used at the transmitter is identifiable at the receiver as being of a predetermined form. In this connection with regard to FIG. 10 the modulation is at a predetermined frequency and the demodulation involves the use of a filter for demodulating this frequency.

In FIG. 9 the output of the comparator 31A will go to its high state when an alarm occurs to energize a relay (not shown) or the output could be used to increase the current through the bus 10-12 by switching a load thereacross. The strobing of transistor Q2 is, as previously mentioned, at a low duty cycle and thus the output from the comparator 31A will be of relatively short duration. If it is desired to lock in the alarm, the output may be used to gate the strobe transistor Q2 by way of the line 12B. With this arrangement as long as the signal level is sufficiently large in magnitude indicating the presence of smoke, the gating transistor Q2 will be enabled by way of line 12B.

In the presence of smoke with the embodiment of FIG. 9 the demodulator 30 detects the coded transmitter signal and the output is coupled by way of a diode D4 to the integrator which comprises resistor R10 and capacitor C4. The capacitor C4 is essentially connected into the circuit only during the strobe period as set by line 12A and if there is a smoke detection then a sufficient magnitude of voltage is established across capacitor C4 to cause triggering of the threshold comparator 31A. It is this signal that signals an output alarm at the output of the comparator 31A. Furthermore, this signal may be locked in by means of the signal in line 12B locking the transistor Q2 to a continuous operation rather than a strobed operation.

FIG. 10 shows a receiver circuit that is strobed from the strobe transistor Q2 whose input couples from the strobe 14 such as the one shown in FIG. 6. The amplifiers 26 and 32 are shown as single stage amplifiers but may be replaced by a multiple stage amplifier. The demodulation is provided in this arrangement by means of a highpass filter. However, other types of filters can also be employed including a plurality of filters to achieve better roll-off characteristics. An alternative to a highpass filter could also be a bandpass filter. This filter arrangement includes a transistor 30A, a potentiometer 30B, along with associated resistors and capacitors. The filter circuit 30 shown in FIG. 10 may be of well-known conventional design.

As previously indicated, in order to conserve power, both the transmitter and receiver circuits are pulsed once every, for example, 5 or 10 seconds. The circuit is arranged so that the transistor Q2 shown in FIG. 10 is pulsed on for a relatively short period of time of anywhere from 5-20 milliseconds. When transistor Q2 is turned on, the receiver 24 is essentially immediately enabled. However, at the transmitter end, as depicted, for example, in FIG. 6, the circuit is initially off when power is turned on and there is only a strobe after a delay. This results in the transmitting portion of the system being turned on slightly after the receiving portion is turned on. This has the advantage of allowing the receiver portion of the circuit to settle down before the transmitter is activated.

As long as the voltage at the input to comparator 33A does not exceed the trigger or threshold voltage, there will be no output to the second comparator 33B. The network comprising resistors R1 and C1 associated with comparator 33A has a very short time constant on the order of a few microseconds. This time constant may be adjusted for any value of the transmitter pulse width. Because only one pulse is received every 5 or 10 seconds, the filter does not in fact discriminate with regard to frequency. It does, however, allow the fast narrow pulse to commutate through the low value filter capacitors.

When smoke is detected, there is an increase in amplitude at the output of the amplifier 32 which, when the threshold of comparator 33A is exceeded causes the comparator 33A to trigger with its output going to its high state. The output of this coupled by way of line 12B locks in transistor Q2 as previously mentioned, and also causes a charging of capacitor C5. The time constant of resistor R5 along with capacitor C5 is relatively long, such as 2 seconds. The filter circuit 30 will only pass those frequencies that correspond to the emitted frequencies. Therefore, ambient light, such as that generated by tungsten or fluorescent sources is substantially attenuated and essentially not passed by the filter circuit 30.

Figure 11:
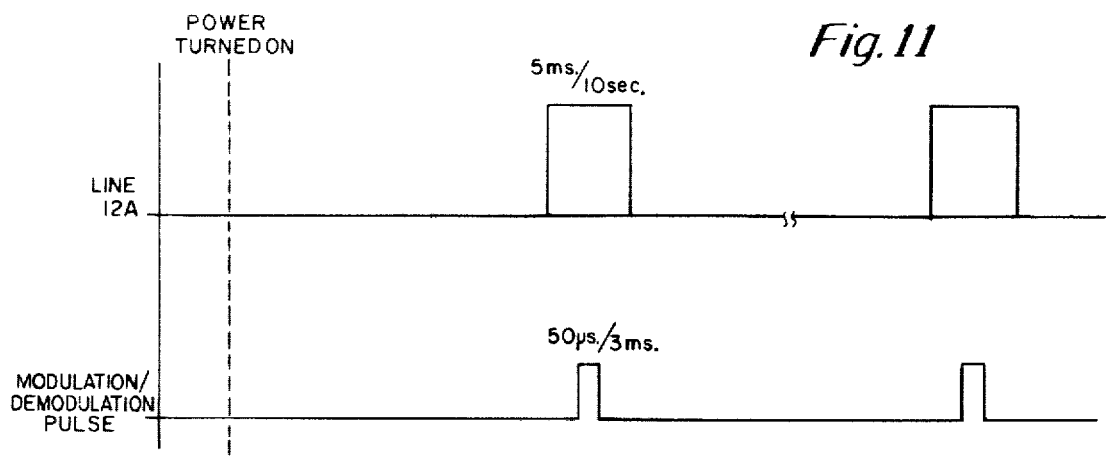
FIG. 11 shows waveforms associated with the operation of one system of this invention.

FIG. 11 shows two important waveforms used in connection with the circuit of FIG. 10. The first waveform shows the basic strobe line which in this example is a 5 millisecond width pulse occurring every 10 seconds. During the 5 millisecond pulse there is generated, as shown on the second diagram a pulse of 5 microsecond duration. One pulse has been shown but actually during the time period more than one pulse could be used. It is this pulse that is demodulated and sensed by the filter circuit 30 when such is detected by the receiver 24 in the presence of a smoke detection.

The output of amplifier 32 is shown at terminal Y and connects to the input of the circuit of FIG. 3. The output of the gain control circuit of FIG. 3 connects to terminal X also shown in FIG. 10 at the input to amplifier 26. The output of the amplifier 32 at terminal Y is preferably gated off during the strobe lock period when smoke is sensed. This prevents the automatic gain control from compensating during an alarm condition. The purpose of the gain control is to compensate only for signals below the alarm threshold level.

The delayed AGC circuit of FIG. 3 is also strobed. Note the connection to line 20 in FIG. 1 which is the strobe line. This line is also referred to herein as strobe line 12A. The input to the circuit of FIG. 3 from amplifier 32 is only present when the receiver is being strobed. The capacitors 114 and 116 of FIG. 3 normally sample the quiescent voltage at the output of amplifier 32 only during the strobe period of say 5 milliseconds. If there is a signal present due to smoke, the duration of this signal is for only say 50 microseconds as mentioned in connection with FIG. 11. Thus, the capacitors 114 and 116 will self discharge during the long off time. Because of this, these capacitors and in particular capacitor 116 is selected to have a very low leakage. A typical capacitor used is a polystyrene type.

In conventional AGC circuits filters are used to suppress the effect of high amplitude inputs by inserting a short time constant filter. In these prior art circuits the filter is for providing a DC bias for the control transistor which may be a field effect transistor. In accordance with the present invention there is provided a delayed AGC which essentially seeks to do the opposite by inserting as long a delay as possible for the feedback to take effect. Thus, step functions and high amplitude signals are encouraged to bypass the AGC feedback circuit.

Other delay systems such as one described in U.S. Pat. No. 3,155,954 cancel out sporadic sounds of any amplitude and rely upon persistence for detection. The delayed AGC concept of the present invention cancels either sporadic or persistent signals of low amplitude. Additionally, while prior circuits are insensitive for a predetermined time period, the delayed AGC of this invention is continuously adjusting with no time limit. Additionally, the direct coupling of the delayed AGC avoids the problems encountered with a capacitively coupled AGC which reacts very quickly. Capacitive coupling also makes it impossible for the AGC to continuously vary the gain. Additionally capacitive coupling is not preferably used for a strobed AGC system.

Another advantage of the system of this invention is that, when used with an optically biased detector, there is a light level already established which allows the AGC to start from a point of reference. This point of reference is the low level biasing signal. Thus, the gain is initially set at a level that is accepted as a reference quiescent level. Any change, whether an increase or decrease results in the delayed AGC attempting to bring the reference back to the initial reference point.

Figure 12A:
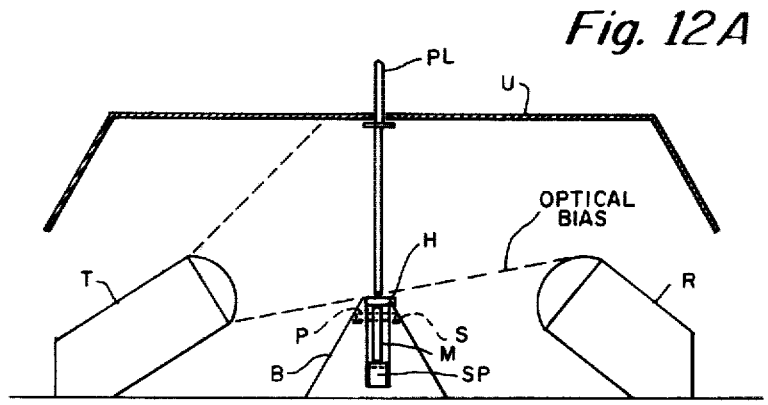
FIGS. 12A and 12B show an apparatus for testing the detector.
Figure 12B:
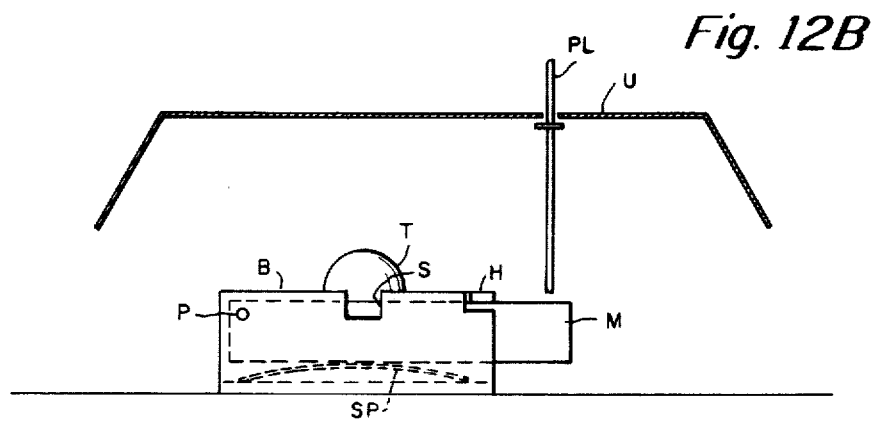

FIGS. 12A and 12B schematically depict an arrangement for the transmitter and receiver identified in this embodiment as transmitter T and receiver R. The transmitter may comprise a light emitting diode that is strobed and the receiver may comprise a photo-transistor that also may be strobed in accordance with the teachings described hereinbefore. In FIGS. 12A and 12B the transmitter T projects a beam of energy into the field of view of receiver R. There is also provided a barrier B arranged so that it does not quite obscure the beam, thus providing some optical biasing for the receiver R. Within the barrier B there is provided a movable member M and the barrier B is provided with a slot S. As noted in FIG. 12B the movable member M obscures a section of the slot S. The movable member is actually pivoted at pivot point P and has an upper position limited by the overhang H which may form a part of the barrier B. Thus, the member M is limited in movement except in the direction toward the spring SP.

When the plunger P is pushed in the direction toward the housing U the member M moves out of the slot S so that the slot is no longer obscured. In this way more radiant energy now reaches the receiver thus simulating an alarm signal simulating the reflection off of the smoke particles. By controlling the dimensions of the slot and the extent of movement of the member M, the amount of extra illumination impinges on the sensor may be tightly controlled to thus simulate the required percentage of smoke. When the plunger is released, the spring SP restores the movable member to its original rest position abutting the overhang H.

Reference has been made hereinbefore to a U.S. Pat. to Larrick, et al No. 3,155,954. This patent discloses an automatic sensitivity control loop. One of the problems with this prior art construction is that there is a lack of a memory function, whereas, in accordance with the automatic gain control circuit of FIG. 3 of the present application, the circuit is continuously refreshed. The purpose of the capacitors 114 and 116 in FIG. 3 is to store or remember by increments the previous DC voltage as commutated by diode 112. In FIG. 3 the resistor 106 used to artificially bleed off charge from the capacitors at a very slow rate in order to compensate for the DC output at the anode of diode 112 falling instead of increasing. Thus, for example, if previously the required quiescent output was 3 volts (at output from amplifier 32) and then due to lamp aging or other conditions the voltage dropped to 2 volts, the capacitors 114 and 116 essentially remember the 3 volt level. By providing a bleed via resistor 106 the capacitors slowly discharge to the 2 volt level. Any attempt to discharge to a lower voltage would not occur as the 2 volt output via the diode 112 refreshes the capacitors. The low 2 volt bias on transistor 100 causes the gain control to increase the amplifier gain thus causing the output into the gain control circuit to slowly rise to the 3 volt level. In FIG. 3 the resistor 102 has a high value and does not allow the gate of the transistor 100 to see the instantaneous output of the amplifier. The capacitor 114 is a reservoir capacitor that is isolated from the gate of the transistor 100 by diode 110 and a 10 Meg ohm resistor. During the time that the strobe is off the capacitor 114 pumps current into the capacitor 116 and in steps (after many strobe cycles restores the peak value to capacitor 114) brings capacitor 116 to the peak value. However, the peak value decreases slowly because the AGC loop slowly changes the gain of the amplifier.

In connection with the Larrick patent, it is noted in particular that the sensitivity loop is characterized by a response time of long duration as much as a few seconds. This means that for a strobed detector, the sensitivity loop in Larrick is ineffective for the short duration of the strobe period.

FIGS. 13A, B and C show various waveforms associated with the delayed gain control of this invention. In each of these graphs there are shown waveforms of time against the amplifier output such as the output on line 88 coupling to the gain control circuit of FIG. 3. In FIG. 13A there is shown a strobed system with line I indicating the voltage level at line 88 without compensation. Line II shows the rate of compensation possible with the circuit of FIG. 3. Because of this compensation the line III shows the actual voltage at line 88 with the compensation. In the example of FIG. 13A it is noted that the rate of compensation is less than the voltage rise and thus after a plurality of strobe cycles, there will be an alarm triggering.

In FIG. 13B there are shown waveforms for a continuously adjusting gain control with delay such as the circuit of FIG. 3. The line I shows the voltage at line 88 without compensation. In this example it is noted that the voltage has risen to the point P and then is maintained constant. The line II shows the compensation, which is at a faster rate from 0 to the point P and thereafter at a slower rate after the point P. The line 3 shows the actual voltage at line 88. The line IV shows the quiescent voltage. With this arrangement, it is noted that although there has been a rise in voltage the delayed gain control compensates when the voltage is constant to readjust the circuit back toward the quiescent voltage.

FIG. 13C depicts the graph for application of a step function which might occur under an alarm condition. FIG. 13C shows the trigger level TL. In this graph the line I shows the output on line 88 without compensation. The line II shows the rate of compensation with the circuit of FIG. 3. The line III shows the actual voltage at line 88 with this compensation. With this arrangement it is noted that after a plurality of strobe cycles, the voltage at line III reaches the trigger level TL.

Figure 14:
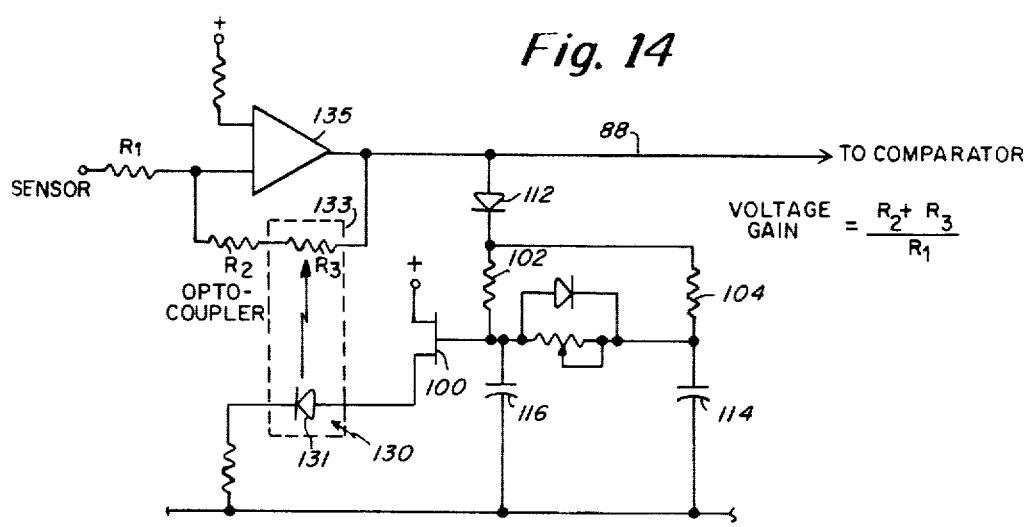
FIG. 14 shows the delayed gain control circuit of FIG. 3 in combination with opto-coupler control of an amplifier.

FIG. 14 shows another arrangement for the gain control in accordance with the invention. In FIG. 14 the circuit may be identical to the one shown in FIG. 3 including the FET transistor 100, capacitors 114 and 116, and associated resistors and diodes. However, the output of transistor 100 couples to an opto-coupler 130 including an LED 131 and a photosensitive resistor 133. It is noted that the resistor 133 is in series with another resistor which determines the gain of amplifier 135. Thus, the compensation in FIG. 14 is by means of directly effecting the gain of amplifier 135 by means of the opto-coupler 130. Again, this compensation is done on a gradual basis dependent upon the setting of the circuitry. A decrease in voltage on line 88 causes an increase of gain in the amplifier 135 and vice versa.

Figure 15:
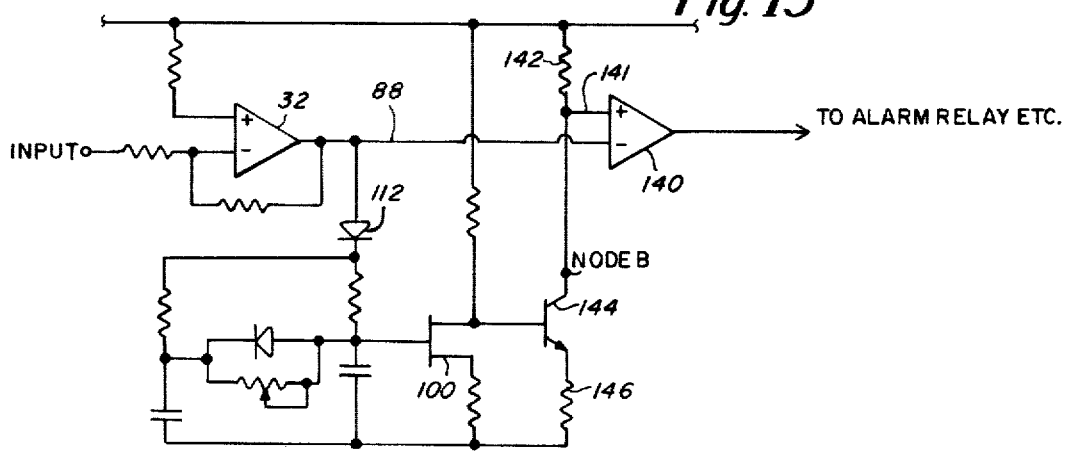
FIG. 15 again shows the delayed gain control of FIG. 3 used in adjusting a reference or trigger level to a comparator.
Figure 16A:
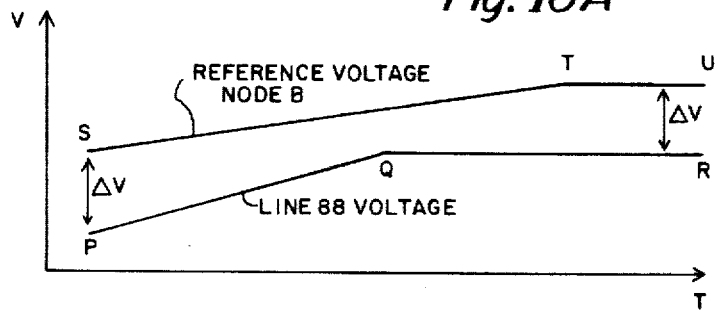
FIGS. 16A and 16B show waveforms associated with the circuit of FIG. 15.
Figure 16B:
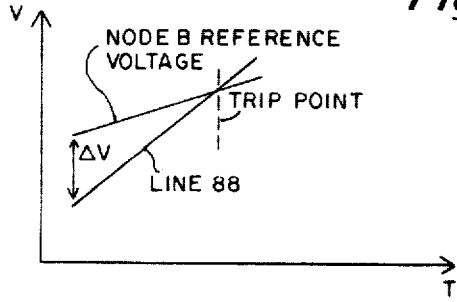

FIG. 15 shows still a further version of the control in accordance with the present invention. Again, the circuitry may be substantially identical to that shown in FIG. 3 including the field effect transistor 100, capacitors 114 and 116, and associated resistors and diodes. In this arrangement there is also shown an amplifier identified as the amplifier 32 also previously referred to in FIG. 1. The output of this amplifier at line 88 couples to the input diode 112. The line 88 also couples to one input of comparator 140. The other input to the comparator at line 141 is the reference input which is determined by resistor 142 and transistor 144 along with its associated emitter resistor 146. FIGS. 16A and 16B show different conditions of operation of the circuit of FIG. 15.

In FIG. 15 as the capacitor 116 slowly charges, the voltage at the output of the transistor 100 reduces. This in turn decreases the drive to transistor 144 which is part of the reference network for the comparator 140. The voltage at the collector of transistor 144 increases so that the voltage at line 88 has to further increase if it is to trip the comparator for its now elevated trip voltage. This in effect maintains the differential between the amplifier output and the comparator trip reference level.

If the amplifier output on line 88 increases at a relatively slow rate from the point P to the point Q in FIG. 16A, the difference between line 88 and the reference line 141 slowly decreases due to the delay. If at point Q the voltage now remains steady, the reference will still change until the capacitor 116 charges completely represented by the point T on the graph thus restoring the differential voltage indicated in FIG. 16A. FIG. 16B represents a trigger condition. Thus, if the voltage at line 88 increases rapidly, the reference voltage cannot respond fast enough and the comparator will trip.

Because there is a delay between the time line 88 reached a voltage to the time that the capacitor 116 is fully charged, the comparator will react only to fast changes. For slow changes the node voltage at node B (line 141) will increase sufficiently for the amplifier output to still be lower than that required for tripping the comparator. Thus, this arrangement provides something analogous to automatic gain control providing the same end result, that is, compensation for slow changes.

For example, if one considers a quiescent reference voltage at node B of 5 volts with line 88 having a nominal voltage at 3.5 volts and if there is a relatively slow change in the voltage at line 88 the increased voltage can cause capacitor 116 to charge and the bias on transistor 144 will change the node voltage to increase it. If the voltage at line 88 increases to 4 volts, the voltage at line 141 may be, for example, 5.2 volts. If the voltage at line 88 slowly rises to 5 volts, the voltage on line 141 will adjust to increase to say 5.5 volts and the comparator will not trip. However, if the voltage changes suddenly from the 3.5 volt level to 5.2 volts due to a smoke sensing, then in the presence of the delay before the capacitor 116 charges allows the comparator to trip as it will take possibly several minutes for the node voltage at node B to adjust.

The same operation also is performed for any reduction in the line voltage at line 88. For this case, the node voltage at node B will be reduced thus keeping the differential to a constant.

The reference control or gain control aspect of this invention illustrated in the preferred circuit of FIG. 3 offers significant advantages over the circuit described in U.S. Pat. No. 3,155,954. This prior art patent is using their feedback circuit primarily for detecting sporadic environmental phenomena, such as external sounds. Furthermore, this system is a capacitively coupled system. This system in this prior art patent is not for discerning between fast rising and slowly varying signals. This prior art system is not meant to provide compensation for slowly varying signals even of high amplitude. In addition, this prior art arrangement is not bi-directional and provides for no compensation of signals of decreasing amplitude and particularly of slow decreasing DC reference signals. The sensitivity compensation in this prior art system is unidirectional and is impressed after a fixed interval of time after being monitored.

In accordance with the present invention, the system responds to low or high amplitude signals of either AC or DC and is also bi-directional and continuously operational while still maintaining a delay. In addition, a memory is included in the circuit that retains the previous output level of the amplifier, thus making it suitable for a strobed system that has the power sporadically applied to the amplifiers in order to conserve power requirements such as in portable systems. Conventional systems do not provide this type of compensation. For example, in the above-referenced patent, the coupling capacitors are not memory capacitors and are discharged during the "off" portion of the strobe cycle. During the "on" phase of the strobe cycle a large spike may be commutated to the control circuit in this prior art patent and this in effect fools the circuit into compensating as though it were a sporadic or AC signal. With the capacitor memory in accordance with this invention the previous level of the amplifier is retained and no signal is passed through the feedback loop unless there was an amplitude difference at the amplifier output on successive power-on portions of the strobe cycle. In this connection with regard to FIG. 3 one can consider an initial voltage level of 3 volts on line 88 upon a quiescent power-on condition. Capacitors 114 and 116 charge slowly towards this voltage. During the "off" period of the strobe, the capacitors retain their charge due to the high input impedance of transistor 100. A very slow discharge results due to the high resistance value of resistor 106. Capacitors 114 and 116 eventually will be pumped up to approximately the voltage at line 88 after many cycles of strobing. The output of transistor 100 follows the voltage across capacitor 116 and is used to change the gain of an amplifier. As previously noted, FIG. 14 shows an opto-coupler arrangement for varying the gain of the amplifier. In the arrangement of FIG. 14 as the voltage increases, the LED becomes brighter and the impedance of the photocell or phototransistor decreases. This in turn is used to reduce the gain of the amplifier and restore it to the desired level. Conversely, a decrease in the amplifier output causes the LED to reduce in intensity and a resistance of the photocell or transistor is increased thus increasing the gain of the amplifier.

With regard to the circuit of FIG. 3 there may be an increase in voltage output of the amplifier at line 88 resulting, for example, from the deposition of dust within the optical path. This typically occurs quite slowly over a long period of time such as days or months. Every time the amplifier is strobed, this prior output appears at line 88. This causes capacitors 114 and 116 to charge to a slightly higher voltage gradually. This charging is not done instantaneously due to the high time constant of resistor 102 over many cycles of strobing. Thus, it may require ten strobe cycles before the capacitors reach the value of the amplifier output. However, partial compensation occurs during each strobe cycle as only a fraction of the voltage appearing at line 88 is impressed on the capacitors due to the delay. The output at line 88 follows a certain rate, which is partially modified during each strobe cycle. If the dust level remains constant, then within a given number of cycles the capacitors will charge sufficiently to reduce the level at 88 to the condition it was before the deposition of dust.

The same compensation mechanism applies for a reduction in the output of the amplifier such as could be caused by a change in light intensity of the transmitting LED due to aging. Again, this is a slow process. As the voltage decreases, the capacitors discharge slowly into resistor 106 as diode 112 blocks discharge elsewhere. Eventually the voltage at capacitors 114 and 116 drops below the voltage at line 88. On the next strobe cycle, the capacitors are refreshed to the voltage at line 88. The lower voltages at the capacitors are, of course, used to control the gain of the amplifier as described hereinbefore.

While the system compensates for slow increases or decreases, any large increase such as a step function is recognized as an abnormal condition and is used to trip the system. If the voltage increases rapidly from say 3 volts to 5 volts, only partial compensation can occur during this period of time, say 0.1 volts per strobe cycle. This will therefore allow the signal to trip the alarm. However, if the level attempts to increase over the same voltage range over a period of hours, the compensation will come into effect. In this connection please refer to the previously discussed diagrams in FIGS. 13A, B and C and also FIGS. 16A and B.

The control will also function for a system that is not strobed such as described in FIG. 13B. The difference is that the instantaneous level of the feedback is a fraction of the voltage output and the control continues even after the level on line 88 stops increasing or decreasing. If the amplifier voltage tends to slowly rise from say 3 volts to 4 volts and remains steady at 4 volts as depicted in FIG. 13B as the voltage rises, the voltage at the capacitors 114 and 116 increases even slower so that the rate of rise at line 88 is slowed by say 10% depending upon the time constant of resistor 102 along with capacitors 114 and 116. When the line 88 eventually reaches the 4 volt level, the voltage across the capacitors will be approximately 3.1 volts. However, these capacitors will slowly increase in voltage and so cause the gain of the amplifier to decrease, which in turn will cause line 88 to decrease down to the quiescent voltage.

The purpose of capacitor 114 is to act as the basic memory or reservoir capacitor. In this regard it is noted that although resistor 102 has a large value, resistor 104 has a relatively smaller value so that the capacitor 114 is allowed to charge much more rapidly than the capacitor 116. The time constants may be in the ratio of 10 to 1. During the "off" phase of the strobe cycle the capacitor 114, which has memorized the voltage at line 88 during the previous "on" phase, now discharges via potentiometer 108 slowly into capacitor 116 which is at a lower voltage. Thus, compensation occurs even during the off portion of the cycle. The diode 110 allows the capacitor 116 to discharge into the resistor 106 if a falling voltage occurs at line 88 rather than a rising voltage.

Other embodiments of the invention will occur to those skilled in the art and the following claims are intended to define the scope of the invention.

What is claimed is:

1. A smoke detector for detecting a product of combustion within a detection chamber that receives air from outside the detector and that has a radiant energy source, and receiver means including a radiant energy transducer, the improvement comprising automatic gain control circuit means for sensing relatively slow changes in a signal level to compensate bidirectionally for variations from a quiescent signal level to prevent false triggering of the detector, said receiver means having means defining a first node from which the signal level is taken and a second node that is to be controlled, said automatic gain control circuit means coupled between said first and second nodes for providing a delayed form of control, said automatic gain control circuit means comprising a semiconductor control device for controlling said second node voltage and input circuit means including delay means coupled from said first node, said delay means providing a predetermined delay of signals from the first to second node.

2. A smoke detector as set forth in claim 1 including;
a modulator coupled to the radiant source for varying the energy output of said radiant source according to a predetermined pattern,
a demodulator,
first circuit means coupling the radiant energy transducer to the demodulator, said demodulator for detecting that portion of said transducer signal output corresponding to said predetermined pattern,
alarm means,
second circuit means coupling the output of the demodulator to the alarm means.

3. A smoke detector as set forth in claim 2 wherein said first circuit means includes a gain-controlled amplifier means and said automatic gain control circuit means includes an automatic gain control circuit responsive to a signal downstream of the demodulator to control the gain of the amplifier means.

4. A smoke detector as set forth in claim 3 wherein said amplifier means comprises an operational amplifier and said second circuit means comprises a gain-controlled amplifier means, the output of said second amplifier means coupling to the input of said gain control circuit.

5. A smoke detector as set forth in claim 3 wherein said semiconductor control device comprises a transistor and said delay means capacitor delay circuit.

6. A smoke detector as set forth in claim 2 wherein said automatic gain control circuit means operates to inhibit signals of less than a predetermined threshold rise in volts/second.

7. A smoke detector as set forth in claim 6 wherein said threshold rise in volts/second is on the order of a maximum of 0.1 volts/second.

8. A smoke detector as set forth in claim 2 wherein at least a portion of the light output of the radiant source is directly received by the transducer in the absence and presence of smoke.

9. A smoke detector as set forth in claim 2 wherein said automatic gain control circuit means includes delay means for permitting alarm triggering only after several strobe cycles.

10. A smoke detector for detecting a product of combustion comprising:
a radiant source,
a radiant energy transducer,
a strobe means,
means for coupling the strobe means to operate both the radiant source and the transducer on a strobed basis,
detection circuitry including a threshold detector coupled from the transducer,
feedback means responsive to a threshold detection for locking the strobe means into continuous operation of the source and transducer,
and gain control feedback means in the direction circuitry having a long time delay to enable rapid signal changes to be transmitted without gain control.

11. A smoke detector as set forth in claim 1 wherein said delay means comprises input resistor means, at least one capacitor wherein said input resistor means is for rapidly charging the once capacitor and means for blocking any substantial discharge of the one capacitor.

12. A smoke detector as set forth in claim 11 including a second storage capacitor and resistor network coupling between capacitors to permit one capacitor to discharge into the other.

13. A smoke detector as set forth in claim 12 wherein the resistor network includes a resistor in parallel with a rectifier.

14. A smoke detector as set forth in claim 1 including strobe means for strobing the radiant energy source, the radiant energy transducer, the detection circuitry and the monitoring circuit means on a low duty cycle basis substantially below a 50% "on" duty cycle.

15. A smoke detector as set forth in claim 1 including strobe means for strobing at least the monitoring circuit means, source and transducer at a low duty cycle below a 50% "on" duty cycle, said memory storage means holding a previous signal level during the longer "off" portion of the strobe cycle.

16. A smoke detector as set forth in claim 1 wherein said receiving means includes a trigger means having a reference input controlled from said monitoring circuit means.

* * * * *